United States Patent
Bechtel et al.

(10) Patent No.: US 11,320,459 B2
(45) Date of Patent: May 3, 2022

(54) MEASURING SYSTEM

(71) Applicant: Endress+Hauser SE+Co. KG, Maulburg (DE)

(72) Inventors: Gerd Bechtel, Steinen (DE); Franco Ferraro, Schopfheim (DE); Robert Schmidt, Schopfheim (DE); Armin Wernet, Rheinfelden (DE)

(73) Assignee: ENDRESS+HAUSER SE+CO. KG, Maulburg (DE)

( * ) Notice: Subject to any disclaimer, the term of this patent is extended or adjusted under 35 U.S.C. 154(b) by 165 days.

(21) Appl. No.: 16/623,825

(22) PCT Filed: May 18, 2018

(86) PCT No.: PCT/EP2018/063090
§ 371 (c)(1),
(2) Date: Dec. 18, 2019

(87) PCT Pub. No.: WO2019/001846
PCT Pub. Date: Jan. 3, 2019

(65) Prior Publication Data
US 2020/0400717 A1      Dec. 24, 2020

(30) Foreign Application Priority Data

Jun. 29, 2017   (DE) .................... 10 2017 114 555.9

(51) Int. Cl.
*G01R 1/04* (2006.01)
*G01D 11/24* (2006.01)
(Continued)

(52) U.S. Cl.
CPC ......... *G01R 1/0416* (2013.01); *G01D 11/245* (2013.01); *H01R 13/5213* (2013.01); *G01R 1/206* (2013.01)

(58) Field of Classification Search
None
See application file for complete search history.

(56) References Cited

U.S. PATENT DOCUMENTS

| 2003/0173954 A1* | 9/2003 | Terui | G01D 11/245 |
| | | | 324/207.21 |
| 2008/0164866 A1* | 7/2008 | Steinich | G01D 11/245 |
| | | | 324/207.2 |

(Continued)

FOREIGN PATENT DOCUMENTS

| CN | 1376261 A | 10/2002 |
| CN | 101586940 A | 11/2009 |

(Continued)

OTHER PUBLICATIONS

E11078 Schutzkappe für Einbauadapter, ifm electronic gmbh, Mar. 6, 2003, 1 pp.
(Continued)

*Primary Examiner* — Jas A Sanghera
(74) *Attorney, Agent, or Firm* — Christopher R. Powers; Endress+Hauser (USA) Holding Inc.

(57) ABSTRACT

The present disclosure relates to a measuring system including: an automation field device embodied for determining and/or monitoring a process variable of a medium; a connection unit, which includes a connection plug, which is electrically connected with the field device, and a cable, which is connected to the connection plug with a cable connection and which serves for supplying the field device with electrical energy and/or for transmitting information between the field device and a superordinated unit; and a protective cover, which surrounds the connection unit and the field device connected with the connection unit in a protection section, wherein by means of the protective cover the impact resistance of the measuring system in the protection section is increased.

16 Claims, 2 Drawing Sheets

(51) Int. Cl.
*H01R 13/52* (2006.01)
*G01R 1/20* (2006.01)

(56) References Cited

U.S. PATENT DOCUMENTS

| | | | | |
|---|---|---|---|---|
| 2009/0095074 A1* | 4/2009 | Vinshtok | ............... | G01D 11/245 |
| | | | | 73/431 |
| 2009/0289623 A1* | 11/2009 | Sano | ............ | G01B 7/30 |
| | | | | 324/207.25 |
| 2015/0192430 A1* | 7/2015 | Blokland | ............. | H01R 12/585 |
| | | | | 324/207.25 |

FOREIGN PATENT DOCUMENTS

| | | | |
|---|---|---|---|
| CN | 101900592 | A | 12/2010 |
| CN | 104169689 | A | 11/2014 |
| CN | 104567982 | A | 4/2015 |
| CN | 105659443 | A | 6/2016 |
| DE | 29612454 | U1 | 10/1996 |
| DE | 102008052912 | A1 | 5/2010 |
| DE | 102013111696 | A1 | 4/2015 |
| DE | 102013111714 | A1 | 4/2015 |
| EP | 2105716 | A1 | 9/2009 |
| EP | 2515380 | A1 | 10/2012 |

OTHER PUBLICATIONS

Amtsblatt der Europäischen Union, Mar. 29, 2014, 48 pp.
Atex Explosionsschutz, Katalog 2005/2006, 38 pp.

\* cited by examiner

MEASURING SYSTEM

CROSS-REFERENCE TO RELATED APPLICATIONS

The present application is related to and claims the priority benefit of German Patent Application No. 10 2017 114 555.9, filed on Jun. 29, 2017, and International Patent Application No. PCT/EP2018/063090, filed on May 18, 2018, the entire contents of which are incorporated herein by reference.

TECHNICAL FIELD

The invention relates to a measuring system comprising an automation field device embodied for determining and/or monitoring a process variable of a medium and having a connection unit. The connection unit includes a connection plug, which is electrically connected with the field device, and a cable, which is connected to the connection plug with a cable connection. The cable serves for supplying the field device with electrical energy and/or for transmitting information between the field device and a superordinated unit.

BACKGROUND

In automation technology, field devices are applied for determining and/or monitoring process variables. Referred to as field devices in the context of the present invention are, in principle, all measuring devices, which are applied near to the process and which deliver, or process, process relevant information. Involved, for example, are fill level measuring devices, flow measuring devices, pressure- and temperature measuring devices, pH-redox potential measuring devices, conductivity measuring devices, etc., which register the corresponding process variables, fill level, flow, pressure, temperature, pH value, and conductivity. Such field devices are manufactured and sold in various embodiments by the E+H group of companies.

Such field devices, which also are used in explosion endangered regions, for example, in an explosively dusty atmosphere, must satisfy very high safety requirements as regards explosion protection. Such is, e.g., required in order to conform to the requirements of the European ATEX directive.

In such case, of concern, especially, is safely to prevent the forming of sparks or at least to assure that a spark arisen upon malfunction has no effects on the environment. In connection with explosion protection, there are different ignition protection types, each of which is also manifested in relevant standards concerning electrical operating means for explosion endangered regions. One standard, for example, is the ignition protection type, dust-Ex. In the case of electrical devices, which are embodied according to this protection class, it must, e.g., based on housing protection be assured that no dust can enter into the housing, which otherwise in connection with an ignition source arranged in the interior of the housing, such as, for instance, electrical contacts, can lead to an explosion. The housing must for this, thus, be sufficiently dust tight. Additionally, it needs to be assured that the housing also cannot be damaged by an impact in such a manner that it is no longer sufficiently tight. The housing must, thus, supplementally to the sealing, also have a sufficient mechanical strength.

In order to test, whether a sufficiently high mechanical strength is present, e.g., impact tests are performed in the context of a conformity evaluation. In such case, a predetermined mechanical impact energy is exerted on a region identified as a weak point of the measuring system, in that an impact test body is caused to fall from a certain height onto the weak point. For classification of the resistance of housings against impact loading of a certain impact energy, e.g., the IK Impact Protection Rating is used.

In such case, the requirements relative to seal and mechanical strength are placed not only on the field device applied near to the process but, in given cases, also on the measuring system, comprising the field device and the connection unit.

One possibility, therefore, is to design the measuring system from the beginning with a sufficient seal and mechanical strength, for example, by the selection of a special, tight geometry and/or the selection of an appropriate material for the connecting unit.

Disadvantageous in such solution is that often predetermined prefabricated or prefabricatable connection units are used, or that even in a process installation of a user there are preinstalled connection units already present, on which a user preferably relies. These fulfill, for example, the requirement for seal, but not, however, that for mechanical strength. Especially, the field device has, i.e., without the connection unit, typically a higher impact resistance than the measuring system comprising the field device and the connection unit. A region of lower impact resistance is, thus, created when just some available connection unit is used, especially in the region of the connection plug. Therefore, the measuring system, in given cases, cannot pass the impact test, so that, after an impact, it can no longer be guaranteed that the measuring system is sufficiently dust tight.

SUMMARY

An object of the invention, therefore, is to provide a solution, in order in a measuring system, especially locally, to increase the mechanical strength of the measuring system.

The object is achieved by a measuring system comprising: an automation field device embodied for determining and/or monitoring a process variable of a medium; a connection unit, which includes a connection plug, which is electrically connected with the field device, and a cable, which is connected to the connection plug with a cable connection and which serves for supplying the field device with electrical energy and/or for transmitting information between the field device and a superordinated unit; and a protective cover, which surrounds the connection unit and the field device connected with the connection unit in a protection section, wherein by means of the protective cover the impact resistance of the measuring system in the protection section is increased.

By means of the protective cover, the measuring system is, thus, subsequently converted into a measuring system of increased impact resistance, independently of the particular embodiment of the connection unit. For this, the protective cover at least partially surrounds the connection unit and the field device connected with the connection unit in the protection section. Because of the supplemental application of the protective cover, a predeterminable impact resistance can be achieved for the measuring system, especially an impact resistance comparable to that of the field device. By means of the embodiment of the protective cover, a higher, especially e.g., a predeterminable, impact resistance of the measuring system is achieved in the protection section. The protection section is, in such case, a local region at least of a part of the connection unit and of the field device connected therewith.

An advantage of the solution of the invention provides that the requirements for seal and for impact resistance are decoupled from one another. The seal can be assured, e.g., by means of the embodiment of the connection unit, without placing additional limitations on the connection unit for requirements of impact resistance. In this way, connection units with any impact resistance can be used. Since the impact resistance is achieved by means of the additional, protective cover, a retained seal of the measuring system is assured, even under action of an impact. In this way, the measuring system of the invention fulfills the provisions of a dust-Ex-ignition protection class, which an otherwise equally embodied measuring system without protective cover, in given cases, does not fulfill.

In an embodiment of the invention, the connection plug is connected with the field device in a connection region, which relative to a process connection of the field device is arranged on a process far side of the process connection. In given cases, different requirements relative to safety standards exist at process far and process facing sides of the process connection.

In an additional embodiment of the invention, the protection section extends at least from the connection region to the cable connection. In this way, the protection section includes at least the connection plug and its connection with the field device and with the cable connection. Since the cable is flexible, the region of the cable bordering on the cable connection is insensitive to impact loadings.

The protection section lies especially on the process far side of the process connection. The protective cover is, thus, arranged only on the process far side of the process connection. Thus, the protective cover of the invention does not serve for protecting the process exposed section of the field device. Such section is, for instance, a sensitive unit of the field device coming in contact with the process, thus a section, which is protected against chemical-physical loading by the process, e.g., by a completely different protective cover.

In an advantageous, further development of the invention, the protection section extends over a region, which is larger than the region bounded by the connection region and the cable connection.

Especially, however, the protection section extends over a region, which is larger by a maximum of 100% than the region bounded by the connection region and the cable connection. Preferably, the protection section extends over a region, which is greater by a maximum of 50% than the region bounded by the connection region and the cable connection.

The protection section is, thus, especially doubly and preferably 1.5 times larger than the region bounded by the connection plug and its connection with the field device, and with the cable connection. In this advantageous, further development, it is, thus, especially supplementally limited, as to how far the protection section is locally limited, or to what extent the protective cover protects only a region of the measuring system, which locally bounds the connection plug.

In an additional embodiment of the invention, the connection plug is electrically connected with the field device by pushing the connection plug onto connection pins of the field device. The connection pins serve, consequently, at least for the electrical connection of connection plug and field device. In given cases, the connection pins serve supplementally also for mechanical connection. However, also other mechanical means can be provided for connection in the connection region.

In an especially preferred further development of the invention, the protective cover is embodied in such a manner that it is releasable from the measuring system. In this way, the protective cover can especially repeatedly be put on and taken off and especially also can be replaced. In this way, an especially high degree of modularization is achieved, since—, depending on current needs, or requirements, for the measuring system—the impact resistance in the protection section can be set by means of the protective cover to a certain, for example, predeterminable, value. Especially, it is simple to retrofit an existing measuring system in an existing process plant corresponding to increased requirements for impact resistance; especially also a replacement of a first protective cover by a second, more stable protective cover is directly possible.

In an embodiment of the invention, the protective cover includes at least two parts mechanically connectable with one another. Of concern, thus, is a multipart, protective cover. Especially, the parts are screwable and/or pluggable into one another.

In an alternative embodiment of the invention, the protective cover is a single piece.

In an additional embodiment of the invention, the protective cover is screwable onto or into the field device with a screw thread of the field device arranged at an end region of the protection section. The protective cover is connected with the field device by means of the thread on the field device.

In an embodiment of the invention, the protective cover is composed of a metal. Metal materials are preferable due to their stability.

In an additional embodiment of the invention, the protective cover is composed of a synthetic material, e.g., a plastic.

In an especially preferred further development, the field device includes arranged in the protection section a display unit, which is embodied for display of status information and/or the process variable. In the simplest case, for example, a switch status of the field device is displayed in the display unit.

For the case, in which such a display unit is arranged in the protection section, it is desirable that the display unit still be visible after application of the protective cover surrounding the display unit.

In an embodiment, the protective cover includes, consequently, windows, by means of which at least the display unit is visible.

In an additional embodiment, the protective cover includes a transparent material at least in the region of the display unit. Of course, the protective cover can also be completely of a transparent material, for example, a transparent plastic. In this way, the display unit is visible through the protective cover, independently of whether the protective cover has windows. Also, for instance, a nameplate is visible in the case of a transparent protective cover.

A further advantage of a completely transparent protective cover is that the Ex standard provides in such case lower impact energies in the impact resistance test. Thus, a transparent protective cover, in principle, only has to withstand a lower impact energy, for example, 4J instead of 7J. In this way, due to the transparency, in principle, lower requirements for mechanical strength result, and therewith also a greater freedom for the choice of the material for the transparent protective cover.

In an advantageous, further development, the protective cover includes a screw thread for screwed connection of a tube, especially a metal tube, completely surrounding the cable. A requirement for so-called conduiting of the cable is present in some process plants due to safety-relevant specifications for the measuring system. In addition to protecting the measuring system in the protection section by the use of the protective cover, thus, simultaneously, the opportunity for conduiting is created.

In an additional further development of the invention, by increasing the impact resistance in the protection section, the measuring system fulfills requirements of a protection class, which an otherwise equally embodied measuring system cannot fulfill without the protective cover.

BRIEF DESCRIPTION OF THE DRAWINGS

The invention will now be explained in greater detail based on the appended, schematic drawing, wherein equal reference characters refer to equal features. When perspicuity requires or it otherwise appears sensible, reference characters already shown in earlier figures are omitted in subsequent figures. The figures of the drawing show as follows.

DETAILED DESCRIPTION

Figure 1:
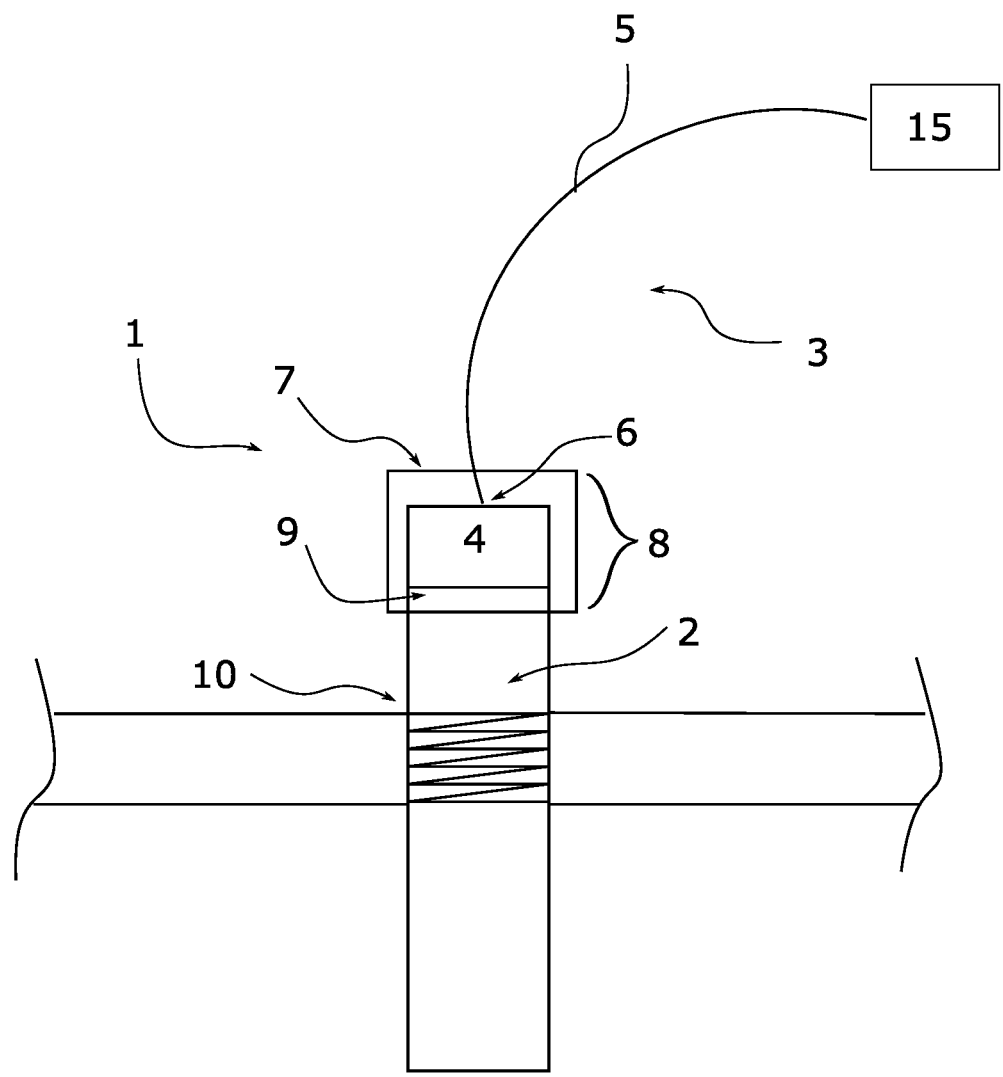
FIG. 1 shows a schematic, sectional view of an embodiment of the measuring system of the present disclosure.
Figure 2:
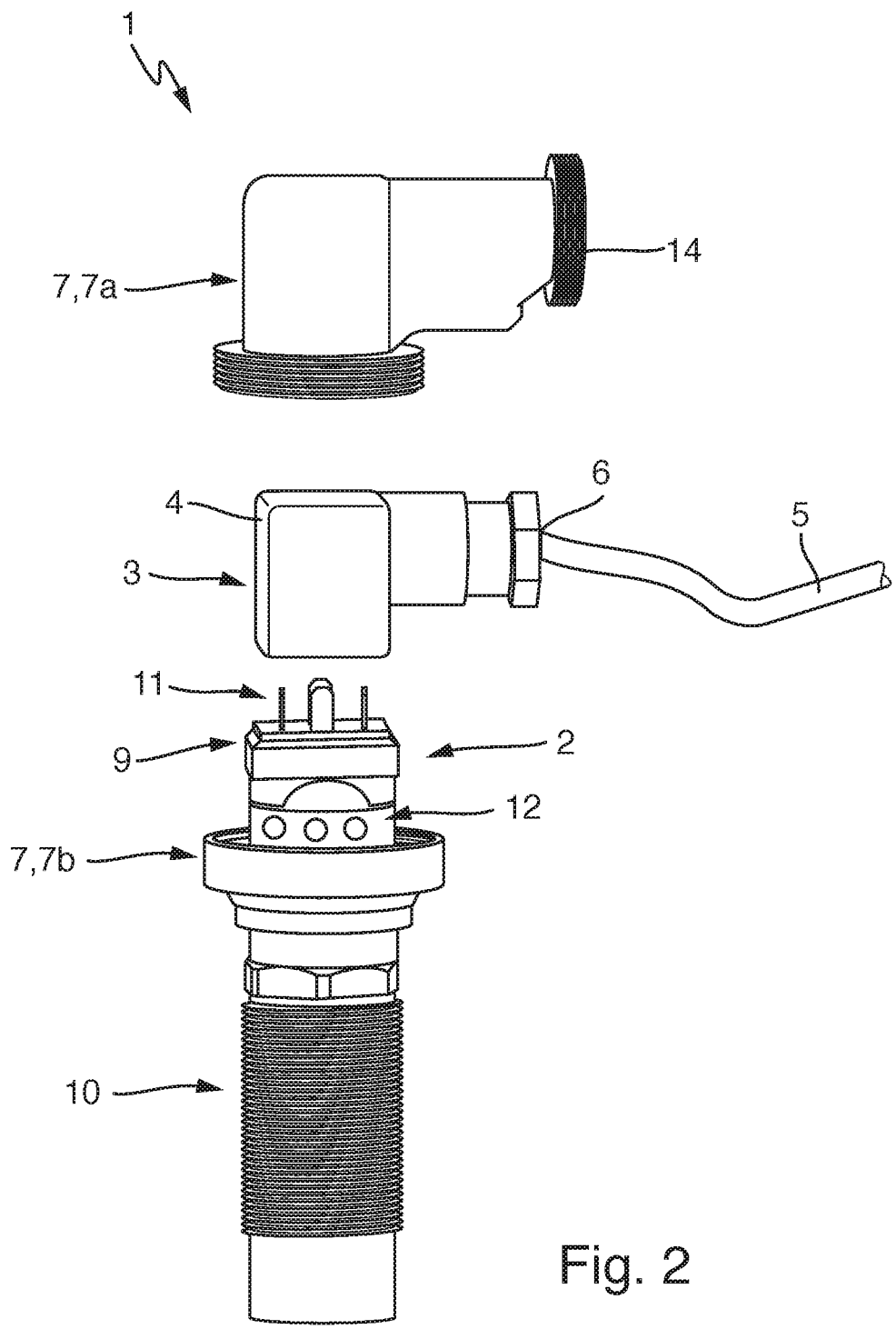
FIG. 2 shows an exploded view of an additional embodiment of a measuring system of the present disclosure.

FIG. 1 a schematic, sectional view of an embodiment of the measuring system of the invention;

FIG. 2 an exploded view of an additional embodiment of a measuring system of the invention.

FIG. 1 shows a schematic, sectional view of a measuring system 1 having a field device 2 installed, e.g., in a container- or pipeline wall via a process connection 10. Field device 2 includes in this example of an embodiment as a sensor unit sensitive for the at least one process variable a mechanical, oscillatable unit schematically illustrated in the form of the rectangular extension at its lower end. The oscillatable unit can, for instance, be an oscillatory fork or membrane, wherein this example is, of course, in no way limiting for the invention.

The connection unit 3 is connected electrically and mechanically with the field device in the connection region 9 of the field device 2. Connection unit 3 includes, in such case, a connection plug 4, wherein the electrical connection between the connection plug 4 and the field device 2 occurs by means of connection pins 11 (shown in FIG. 2) of the field device 2 and the connection plug 4 of the connection unit 3. Connection unit 3 includes, furthermore, a cable 5 having a cable connection 6 connected (i.e. electrically and mechanically connected) to the connection plug 4.

Connection unit 3 is embodied, e.g., as a prefabricated M12 plug unit, i.e. with an M12 screw thread, or even as another connection unit 3 having a screw thread with another thread size. The screw thread of the connection plug 4 provides an additional mechanical connection with the field device 2 in the connection region 9.

The cable 5 can be, e.g., part of a 4-20 mA measurement transmission path, via which the field device 2 is supplied with energy and simultaneously the value of the process variable is transmitted as an electrical current value from the field device 2 to a superordinated unit 15. Cable 5 can, in such case, also be part of a wired communication network, by means of which, such as shown schematically in FIG. 1, information relative to the process variable and status information of the field device 2 are transmitted to the superordinated unit 15. The superordinated unit 15 is, for example, a programmable logic control unit (PLC) arranged in a control station.

The communication network can be, for example, a wired fieldbus of automation technology, for example, a Foundation Fieldbus, Profibus PA, Profibus DP, HART, CANBus, etc. fieldbus, or, however, also a modern industrial communication network, for example, an "Industrial Ethernet" fieldbus, especially a Profinet, HART-IP or Ethernet/IP network or a communication network known from the communication field, for example, Ethernet according to the TCP/IP protocol.

Field device 2 has, per se, a sufficiently high mechanical strength, in order, such as explained above, to be permitted for use in explosion endangered regions.

Because of the use of a predetermined, e.g., standardized or already preinstalled, connection unit 3 having a connection plug 4 of a predetermined material, the measuring system 1, comprising the field device 2 and the connection unit 3, can, however, not have the mechanical strength necessary for use in explosion endangered regions. Especially, e.g., the connection region 9 between connection plug 4 and field device 2 represents a weak point, which typically is examined in a conformity evaluation with an impact test for evaluating impact resistance.

Application of the superimposable protective cover 7 increases the impact resistance of the measuring system in a protection section 8. Protection section 8 extends, in such case, over a region, which is slightly greater than the region bounded by the cable connection 6 and the connection region 9. The protective cover 7 is here embodied as a single piece; it can, however, also be made of a plurality of parts (see FIG. 2). In this example, the one piece protective cover 7 is screwed into a screw thread (not shown) of the field device 2. The screw thread is arranged on an end region of the protection section 8 facing the process connection 10.

By means of the protective cover 7, consequently, the impact resistance of the measuring system 1 is increased locally in the protection section 8. In this way, the measuring system 1 especially meets the requirements of an Ex-dust ignition protection class, while an otherwise equally embodied measuring system 1 without protective cover 7 would not.

Preferably, the protective cover 7 can be repeatedly put on and taken off. Thus, of concern is a modular measuring system 1, which by subsequent application and removal of the protective cover 7 is adapted to current or changing requirements of the explosion protection.

The impact resistance is achieved, in such case, especially by the choice of the material of the protective cover 7. Suited are, e.g., metal materials, however, e.g., also synthetic material with a sufficiently high mechanical durability, such as, for instance, a thermoplastic or thermosetting plastic.

FIG. 2 shows in an exploded view another embodiment of a measuring system 1 of the invention, wherein features already described for FIG. 1 will not be repeated.

In this example of an embodiment, the connection plug 4 is a so-called valve plug, which is pushed onto field device connection pins 11 arranged in the connection region 9. Beneath the connection region 9, the field device 2 includes a display unit 12, which is arranged in the protection section 8.

In this example, display unit 12 comprises three colored LEDs, by means of which, e.g., in the case of a field device 2 formed as a limit level switch with a mechanically oscillatable unit the switch status and, in given cases, other status information are displayed. Displayed as status information on the display unit 12 can be, e.g., whether a malfunction of the mechanically oscillatable unit is present, such as, for instance, accretion on the mechanically oscillatable unit and/or other malfunctions known from the state of the art.

In this example, the protective cover 7 is a protective cover 7 composed of a plurality of parts, here two parts 7a,7b, which can be screwed together. In the case of a first part 7b of the protective cover 7, such is a coupling nut.

The protective cover 7 is here of a completely transparent material, so that information displayed on the display unit 12 is still visible, in spite of protective cover 7. Of course, it is also possible to design the protective cover 7 as only partially transparent, for example, in that only the coupling nut 7b is composed of a transparent material.

Alternatively, the protective cover 7 can also have, in the region of the display unit 12, windows, by means of which the display unit 12 is still visible, for example, in the case of a completely metal, protective cover 7.

Protective cover 7 is placed on the measuring system 1 during the plugging together of the measuring system 1. In such case, in a first step, e.g., the first part 7b of the protective cover 7, embodied as a coupling nut, is placed on the field device 2. Then, the connection unit 3 is guided through the second part 7a of the protective cover; for this, the protective cover must, of course, be correspondingly dimensioned. Then, the connection plug 4 is connected with the field device 2 in the connection region 9 of the field device 2 by pushing the connection plug onto the connection pins. In the last step, the two parts 7a,7b of the protective cover 7 are screwed together. Of course, it is also possible to design the two parts 7a,7b of the protective cover 7 such that they can be pushed together, or be mechanically connected with one another using another type of connection known from the state of the art. Preferred, in such case, within the scope of the invention, are releasable mechanical connections, as compared with, e.g., a soldering or welding, in order that the protective cover 7 can repeatedly be placed on, and therewith be releasable from, the measuring system 1.

Protective cover 7 further includes in this example of an embodiment a screw thread 14 in an end region facing toward the cable. Screwable onto this screw thread is, e.g., an additional, especially metal, tube, with which the cable can be supplementally protected, at least in a section of the cable adjoining the cable connection 6. This additional opportunity for so-called conduiting is desired in some process plants due to safety-relevant specifications.

The invention claimed is:

1. A measuring system, comprising:
an automation field device configured for determining and/or monitoring a process variable of a medium;
a connection unit including a connection plug and a cable connected to the connection plug with a cable connection, the connection plug electrically connected with the field device, wherein the cable is adapted to supply the field device with electrical energy and/or to transmit information between the field device and a superordinated unit; and
a protective cover surrounding the connection unit and the field device connected with the connection unit in a protection region, wherein the protective cover is structured to increase the impact resistance of the measuring system in the protection region.

2. The measuring system of claim 1, wherein the connection plug is connected with the field device in a connection region, the connection region opposite a process connection of the field device.

3. The measuring system of claim 2, wherein the protection region extends at least from the connection region to the cable connection.

4. The measuring system of claim 2, wherein the protection region extends over an area larger than a region bounded by the connection region and the cable connection.

5. The measuring system of claim 2, wherein the protective cover includes a window via which at least the display unit is visible.

6. The measuring system of claim 2, wherein the protective cover includes a transparent section at least in the region of the display unit.

7. The measuring system of claim 1, wherein connection plug is electrically connected with the field device by pushing the connection plug onto connection pins of the field device.

8. The measuring system of claim 1, wherein the protective cover is configured as to be releasable from the measuring system.

9. The measuring system of claim 1, wherein the protective cover includes at least two parts configured to be mechanically connectable with one another.

10. The measuring system of claim 1, wherein the protective cover is a single piece.

11. The measuring system of claim 1, wherein the protective cover is configured to be screwed onto or into the field device via a complementary screw thread of the field device disposed at an end region of the protection region.

12. The measuring system of claim 1, wherein the protective cover is made of a metal.

13. The measuring system of claim 1, wherein the protective cover is made of a synthetic material.

14. The measuring system of claim 1, wherein the field device includes a display unit configured to display of status information and/or the process variable, the display unit disposed in the protection region.

15. The measuring system of claim 1, wherein the protective cover includes a screw thread configured for screwed connection of a conduit surrounding the cable.

16. The measuring system of claim 1, wherein the protective cover is structured to increase the impact resistance of the measuring system in the protection region such that the measuring system fulfills industry requirements of a protection class, which the measuring system could not fulfill without the protective cover.

\* \* \* \* \*